United States Patent [19]

Brasen et al.

[11] Patent Number: 4,566,934
[45] Date of Patent: Jan. 28, 1986

[54] CLEANING TECHNIQUE FOR LPE MELT INGOTS

[75] Inventors: Daniel Brasen, Lake Hiawatha; Michael A. DiGiuseppe, Succasunna; Jose A. Lourenco, Elizabeth; Subhash Mahajan, Summit, all of N.J.

[73] Assignee: AT&T Bell Laboratories, Murray Hill, N.J.

[21] Appl. No.: 437,472

[22] Filed: Oct. 28, 1982

[51] Int. Cl.$^4$ .............................................. C30B 19/00
[52] U.S. Cl. ......................... 156/622; 156/DIG. 111; 156/DIG. 89; 134/3; 134/42
[58] Field of Search ............. 156/622, 638, 650, DIG. 70:DIG. 81, 156/624, DIG. 73, DIG. 111, DIG. 89; 148/171; 427/87; 134/3, 42

[56] References Cited

U.S. PATENT DOCUMENTS 3,677,228  7/1972  Panish et al. ........................ 156/622
3,890,194  6/1975  Ettenberg ............................ 156/622

FOREIGN PATENT DOCUMENTS 133480  10/1979  Japan ................................... 156/622

*Primary Examiner*—Hiram H. Bernstein
*Attorney, Agent, or Firm*—Michael J. Urbano

[57] ABSTRACT

In the liquid phase epitaxy growth of Group III–V compound semiconductors using boat-slider apparatus, melt-carry-over is essentially eliminated by prebaking the metallic solvent (e.g., In shot) in the boat to form ingots and then etching the ingots in dilute nitric or hydrochloric acid prior to adding solutes (e.g., GaAs, InP, dopants). This process removes contaminants which coalesce on the ingots and cause poor wipe-off.

12 Claims, No Drawings

4,566,934

CLEANING TECHNIQUE FOR LPE MELT INGOTS

BACKGROUND OF THE INVENTION

This invention relates to liquid phase epitaxy, and, more particularly, to problems of melt-carry-over when using boat-slider apparatus.

Liquid phase epitaxy (LPE) using boat-slider apparatus is a common technique for epitaxially growing layers of Group III–V compound semiconductors such as GaAs-AlGaAs and InP-InGaAsP on single crystal substrates such as GaAs and InP, respectively. Frequently, multiple layers forming heterostructures are grown as part of the process of fabricating numerous devices: lasers, LEDs, photodiodes, and FETs, for example.

In this LPE technique, the boat, made of graphite, has a plurality of wells for carrying molten source solutions (melts), and the slider, also made of graphite, has at least one recess for carrying the single crystal substrate. (The slider has additional recesses for carrying saturation seeds, but discussion of them is not necessary here.) The boat and slider are positioned in a furnace to heat the melts and substrate to a temperature suitable for epitaxial growth. A controlled cooling program is instituted, and then the substrate is sequentially slid under each of the wells for a time period sufficient to effect growth thereon of epitaxial layers of the desired thickness and composition.

One problem with this LPE technique is poor wipe-off; that is, droplets from the melt of one well remain on the epitaxial layer grown from that melt after the slider has been moved to place the substrate/epilayer under the next well/melt. This melt-carry-over problem manifests itself in several ways. The layer surface is rough because the melt droplets start to dissolve the underlying layer/substrate, resulting in dissolution pits. If a layer is grown on a dissolution pit containing melt material, holes are produced in the epilayer because the melt droplets are undersaturated. Furthermore, since melt material can be trapped in these holes during wipe-off, once dissolution pits have formed, holes extending through all of the epilayers of a device can result. As a consequence, devices such as LEDs exhibit increased infant mortality and electrical instability.

SUMMARY OF THE INVENTION

We have found that, even after the substrate surface has been properly cleaned, poor wipe-off remains a problem. Our investigation shows the contamination in the melts is sufficient to cause melt-carry-over and its concomitant defects in the epitaxial layers. In particular, contamination in the metal solvent (e.g., indium, gallium) has to be reduced even though the starting material may be initially 99.9999 percent pure. In accordance with our invention, we found that, while the solvent is being prebaked in a flowing gas ambient, contamination coalesces on its surface. The contamination constitutes oxides, impurities from the metal solvent, and graphite from the boat-slider apparatus. Accordingly, prior to the addition of a solute (e.g., charge material such as GaAs, InP, or dopants), the prebaked solvent is removed from the LPE furnace and etched in an etchant effective to remove the contaminants. In the LPE growth of InP-InGaAsP layers on InP substrates, etching the prebaked In solvent in dilute nitric acid or hydrochloric acid removes the contaminants and routinely eliminates virtually all of the morphological features associated with melt-carry-over. As a consequence, we have been able to fabricate devices such as LEDs with high reliability and better yield.

DETAILED DECRIPTION

Our invention, together with its various features and advantages, can be readily understood from the following more detailed description. Although the examples below relate to the use of In as a solvent for the LPE growth of In-containing layers, other materials, concentrations, dimensions, temperatures, and other parameters are given by way of illustration only and, unless otherwise stated, are not intended to limit the scope of the invention.

In the LPE fabrication of InP-InGaAsP double heterostructure LEDs and buried heterostructure lasers, we employed the following procedures. Indium shot (pellets), which was 99.9999 percent pure, was obtained from commercial sources. The shot, which is a solid at room temperature, was etched in nitric acid (1:1). Depending on the size of the wells in the graphite boat, the proper amount of shot (either 5 gm or 10 gm) was weighed out and placed into each of the wells. The boat was loaded into the quartz tube in a standard LPE furnace/reactor, and the indium was baked out at 700 degrees C. (well above its melting point of 157 degrees C.) in flowing $H_2$ for about 16 hours. However, the bake-out can be performed over a wide range of temperatures (e.g., 200 to 800 degrees C.) and times (e.g., 1 to 72 hours) and in other ambients (e.g., He). Then, the boat was moved into a cool zone of the reactor and allowed to cool to room temperature while maintaining the $H_2$ flow. The boat was removed from the reactor, and the indium ingots (molded into the shape of the wells) were removed from the boat. At this stage, we found that contamination in the form of oxides, impurities from the indium, and graphite from the boat had coalesced on the surface of the ingots. In accordance with our invention, this contamination was removed by etching the In ingots for about 3 minutes at room temperature in either dilute nitric acid (1:1) or dilute hydrochloric acid (1:1). However, other dilutions are useful; e.g., 2:1, 3:1, 1:2, 1:3, which affect only the amount of In removed from the ingots. In addition, other acids, etching times (e.g., 1–6 minutes), or temperatures may be suitable. The In ingots were then reweighed, and a small amount of In (e.g., 10–20 mg) was added to bring the total weight back to the desired value (e.g., 5 gm or 10 gm). Preferably, the added In is obtained from In ingots purified in accordance with this invention. The ingots were then returned to the boat and baked as before.

After the second bake-out, the In ingots may be stored in bottles for subsequent use. To effect standard LPE growth other constituents (charges) are typically added to the ingots; e.g., GaAs to grow InGaAs layers; GaAs and InP to grown InGaAsP layers; Sn to doped layers n-type; or Zn to dope them p-type. The ingots and constitutents are then suitably homogenized (baked) to form growth melts, and a controlled cooling program is instituted (e.g., heating to 650 degrees C. and cooling at a rate of 0.7 degrees C./min.). Then, an InP substrate is slid sequentially under the melts to effect epitaxial growth of the desired layers.

Using this technique, the morphological features (i.e., dissolution, pits, holes) associated with melt-carry-over have been virtually eliminated. InP-InGaAsP, 1.3 μm double heterostructure LEDs were fabricated and exhibited high reliability and yield.

It is to be understood that the above-described arrangements are merely illustrative of the many possible specific embodiments which can be devised in accordance with these principles by those skilled in the art without departing from the spirit and scope of the invention.

In particular, our technique is applicable to removing contaminants from other LPE solvents such as Ga which is also a solid at room temperature.

What is claimed is:

1. A method of manufacturing a device, which includes growing an epitaxial layer from the liquid phase, comprising the steps of:
   (a) providing a solvent which is a solid at room temperature,
   (b) heating the solid solvent above its melting point in an ambient of flowing gas for an extended period of time so that contaminants tend to coalesce on its surface,
   (c) cooling the solvent to resolidify it,
   (d) etching the solid solvent to remove the contaminants,
   (e) adding solutes to the solvent,
   (f) heating the solute and solvents to form a mixture,
   (g) bringing the mixture into contact with a heated substrate to effect growth of the epitaxial layer thereon.

2. The method of claim 1 wherein the solvent comprises In.

3. The method of claim 2 wherein, in step (d), the indium solvent is etched in an acid selected from the group consisting of nitric acid and hydrochloric acid.

4. The method of claim 1, 2, or 3 wherein the layer grown in step (g) comprises an In-containing Group III-V compound semiconductor.

5. The method of claim 4 wherein, in step (a), the In solvent has a purity of about 99.9999 percent.

6. The method of claim 1 wherein, in step (b), the solvent is heated to a temperature in the range of about 200 to 800 degrees C. for a time of about 1 to 72 hours.

7. The method of claim 1 wherein the gas is $H_2$.

8. A method of manufacturing a device, which includes reducing melt-carry-over in the liquid phase epitaxy growth of a plurality of epitaxial layers on a single crystal substrate using boat-slider apparatus, comprising the steps of:
   (a) loading into a plurality of wells of the boat a quantity of a metallic solvent which is a solid at room temperature,
   (b) placing the boat into a furnace and heating the solvent above its melting point in a flowing gas ambient for an extended period of time so that contaminants tend to coalesce on the surface of the solvent,
   (c) cooling the solvent in the furnace while maintaining the gas flow, thereby to resolidify the solvent into a plurality of ingots,
   (d) removing the boat from the furnace,
   (e) removing the ingots from the boat,
   (f) etching the ingots to remove the contaminants,
   (g) replacing the etched ingots into the wells of the boat,
   (h) adding solutes to preselected ones of the ingots,
   (i) placing the boat back into the furnace and heating the ingots and the solutes to form growth melts therefrom,
   (j) instituting a controlled cooling program, and
   (k) bringing the substrate carried by the slider into sequential contact with the melts to effect growth of the layers thereon.

9. The method of claim 8 wherein the metallic solvent is In.

10. The method of claim 9 wherein, in step (f), the ingots are etched by an acid selected from the group consisting of nitric acid and hydrochloric acid.

11. The method of claim 10 wherein, in step (b), the solvent is heated to a temperature in the range of about 200 to 800 degrees C. for a time of about 1 to 72 hours.

12. The method of claim 8, 9, 10, or 11 wherein the layers grown in step (k) each comprise an In-containing Group III-V compound semiconductor.

* * * * *